(12) United States Patent
Hong

(10) Patent No.: US 7,279,114 B1
(45) Date of Patent: Oct. 9, 2007

(54) METHOD FOR STABILIZING ETCHING PERFORMANCE

(75) Inventor: Shih-Ping Hong, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/430,674

(22) Filed: May 8, 2006

(51) Int. Cl.
G01L 21/30 (2006.01)
H01L 21/00 (2006.01)

(52) U.S. Cl. .............. 216/59; 216/60; 216/67; 216/58; 438/710; 438/734

(58) Field of Classification Search .......... 216/58, 216/59, 60, 67; 438/710, 734
See application file for complete search history.

(56) References Cited

U.S. PATENT DOCUMENTS

| | | | | |
|---|---|---|---|---|
| 5,445,712 A | * | 8/1995 | Yanagida | 438/695 |
| 5,762,813 A | * | 6/1998 | Takiyama et al. | 216/67 |
| 6,383,931 B1 | * | 5/2002 | Flanner et al. | 438/689 |
| 6,417,072 B2 | * | 7/2002 | Coronel et al. | 438/424 |
| 6,818,561 B1 | | 11/2004 | Sonderman | 438/706 |
| 2004/0209477 A1 | * | 10/2004 | Buxbaum et al. | 438/710 |
| 2006/0046329 A1 | * | 3/2006 | Kuisma et al. | 438/21 |

* cited by examiner

Primary Examiner—Shamim Ahmed
(74) Attorney, Agent, or Firm—J.C. Patents

(57) ABSTRACT

The invention is directed to an etching method for patterning a first material layer over a second material layer to expose a portion of the second material layer. The etching method comprises steps of performing a first etching process to remove a portion of the first material layer in an etching chamber and then performing an etching environment adjustment process in the etching chamber. A second etching process is performed on the first material layer and, meanwhile, a real-time etching monitor process is performed for generating an endpoint detection spectrum subsequent to the etching environment adjustment process, wherein at least one of signals of the endpoint detection spectrum is stabilized by the inert gas plasma treatment.

16 Claims, 2 Drawing Sheets

METHOD FOR STABILIZING ETCHING PERFORMANCE

BACKGROUND OF THE INVENTION

1. Field of Invention

The present invention relates a semiconductor process. More particularly, the present invention relates to a method for stabilizing an etching performance.

2. Description of Related Art

With the development of the advanced semiconductor processes, such as 90 nm CMOS processes, the size of the pattern is getting smaller and smaller. Dry etching is an etching technique that bases on the principle of particle bombardment to perform thin film etching. Plasma etching is a type of dry etching, wherein the reacting gas molecule is ionized by plasma to form ions that are reactive with the thin film material. The thin film, after being exposed to plasma, is converted to a volatile product due to the chemical interaction between the ions and the thin film. The volatile product is then removed to complete the etching process.

Currently, the plasma used in the etching process is often generated from a halogen containing gas mixture, which includes carbon tetrafluoride ($CF_4$). $C_4F_8$, $C_5F_8$ or $C_4F_6$ are also being used as reacting gas to provide carbon atoms and fluorine atoms. However, by using this kind of plasma in the etching process, polymer byproduct composed of carbon, fluorine, nitrogen and oxygen elements, is formed in the pattern of the etched material layer and on the wall of the etching chamber when the etching process is completed. In general, the aforementioned polymer byproduct becomes the factor affecting the etching environment within the etching chamber and affecting the performance of the etching process in the posterior etching process step. That is, the endpoint detection is interfered and the interference factor leads to endpoint mis-catch. Therefore, the target layer is etched through and the material layer under the target layer is damaged.

SUMMARY OF THE INVENTION

Accordingly, at least one objective of the present invention is to provide an etching method cooperating with an etching environment adjustment process so that the signal of the endpoint detection spectrum is stable before the endpoint of the etching method is reached.

At least another objective of the present invention is to provide an etching method cooperating with an etching environment adjustment process capable of enlarging the process window of the end-point control process of the etching process.

To achieve these and other advantages and in accordance with the purpose of the invention, as embodied and broadly described herein, the invention provides an etching method for patterning a first material layer over a second material layer to expose a portion of the second material layer. The etching method comprises steps of performing a first etching process to remove a portion of the first material layer in an etching chamber and then performing an etching environment adjustment process in the etching chamber. A second etching process is performed on the first material layer and, meanwhile, a real-time etching monitor process is performed for generating an endpoint detection spectrum subsequent to the etching environment adjustment process, wherein at least one of signals of the endpoint detection spectrum is stabilized by the inert gas plasma treatment.

According to one embodiment of the present invention as described above, the etching environment adjustment process is performed with the use of an adjustment agent.

According to one embodiment of the present invention as described above, the adjustment agent includes an inert gas.

According to one embodiment of the present invention as described above, the inert gas is selected from a group consisting of helium, neon, xenon, radon and the inert gas mixture thereof.

According to one embodiment of the present invention as described above, the flow rate of the inert gas is about 10~1000 sccm.

According to one embodiment of the present invention as described above, the etching environment adjustment process is performed for about 5~60 seconds.

According to one embodiment of the present invention as described above, a source power for the etching environment adjustment process is about 20~800 Watts while the etching environment adjustment process is performed.

According to one embodiment of the present invention as described above, a source power for the etching environment adjustment process is about 20~600 Watts.

According to one embodiment of the present invention as described above, the first material and the second material layer are made of different materials.

The present invention also provides a method for catching an endpoint of an etching process, wherein the etching process is performed in an etching chamber. The method comprises steps of performing an inert gas plasma treatment with an adjustment agent in the etching chamber, wherein a bias power is turned off and then performing an etching process and a real-time etching monitor process for generating an endpoint detection spectrum, wherein at least one of signals of the endpoint detection spectrum is stabilized by the inert gas plasma treatment.

According to one embodiment of the present invention as described above, the adjustment agent includes an inert gas.

According to one embodiment of the present invention as described above, the inert gas is selected from a group consisting of argon, helium, neon, xenon, radon and the inert gas mixture thereof.

According to one embodiment of the present invention as described above, the flow rate of the inert gas is about 10~1000 sccm.

According to one embodiment of the present invention as described above, the inert gas plasma treatment is performed for about 5~60 seconds.

According to one embodiment of the present invention as described above, a source power is about 20~800 Watts while the inert gas plasma treatment is performed.

According to one embodiment of the present invention as described above, a source power for the inert gas plasma treatment is about 20~600 Watts.

In the present invention, before the second etching process is performed, the chamber is treated by an etching environment adjustment process so that the real-time endpoint detection spectrum is relatively smooth before the signal drop, which indicates the occurrence of the etching endpoint, appears. Hence, the process window of the endpoint control process for the second (posterior) etching process is enlarged so that the second etching process can be well controlled.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
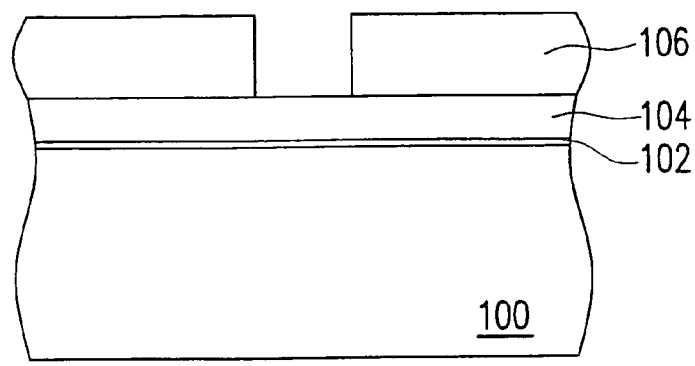
FIGS. 1A through 1C are cross-sectional views illustrating an etching method for defining a first material layer over a second material layer according to a preferred embodiment of the invention.
Figure 1B:
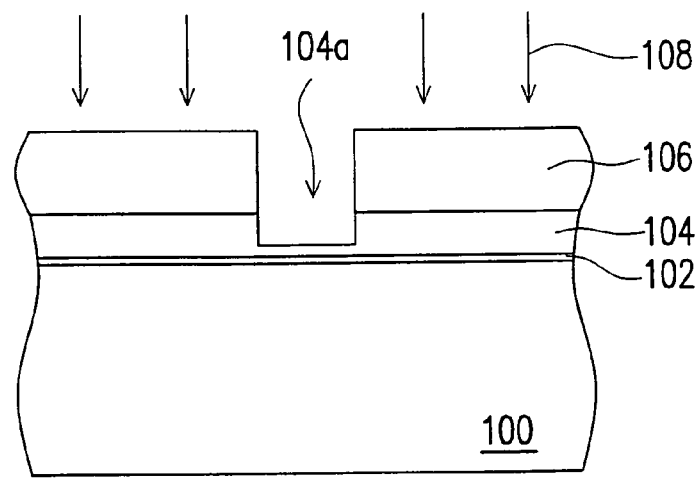
Figure 1C:
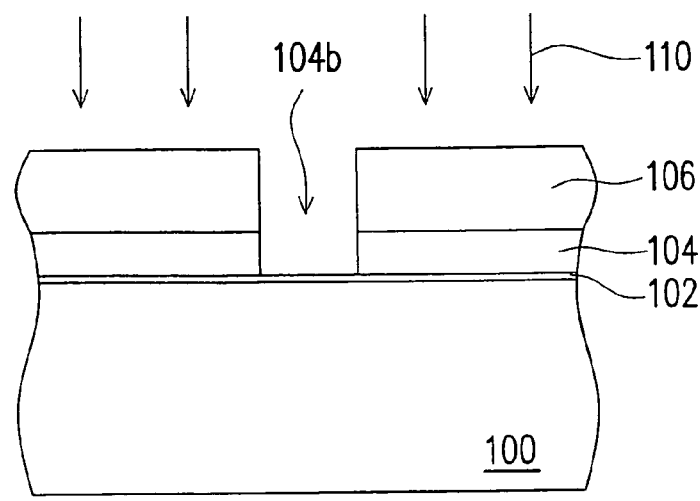
Figure 2:
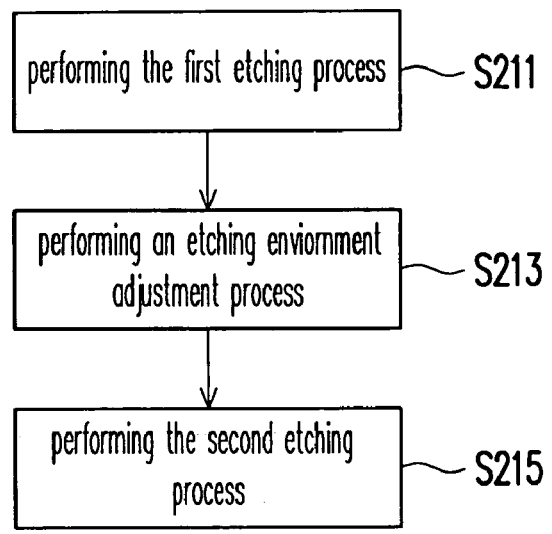
FIG. 2 is a flow chart showing an endpoint catching method for an etching process according to one embodiment of the present invention.

FIGS. 1A through 1C are cross-sectional views illustrating an etching method for defining a first material layer over a second material layer according to a preferred embodiment of the invention. FIG. 2 is a flow chart showing all endpoint catching method for an etching process according to one embodiment of the present invention.

As shown in FIG. 1A, a substrate 100 is provided. A first material layer 104 is located over the substrate 100 and there can be at least one underlay material layers, such as a second material layer 102, located between the substrate 100 and the First material layer 104. Furthermore, the first material layer 104 is made of a material different from the material of the second material layer 102. In a preferred embodiment of the present invention, the first material layer 104 is silicon nitride and the second material layer 102 is silicon oxide. Moreover, the substrate 100 possesses several devices (not shown) formed thereon and therein and the substrate 100 can be, for example but not limited to, a silicon substrate or a silicon-on-insulator substrate. Then, a patterned mask layer 106 is formed on the first material layer 104. The patterned mask layer 106 can be, for example but not limited to, made of photoresist or other proper hard mask material.

As shown in FIG. 1B together with FIG. 2, in the step S211, a first etching process 108 is performed to remove a portion of the first material layer 104 by using the patterned mask layer 106 as a mask. Therefore, an upper opening 104a is formed in the first material layer 104 without penetrating through the first material layer 104. The first etching process 108 can be performed with the use of a first etching gas mixture as a source gas. The first etching gas mixture includes a halogen-containing gas mixture containing $CF_4$ and HBr. The timing for terminating the first etching process 108 can be, for example, controlled by a time-mode controlling model. That is, the first etching process 108 is performed for a specific period of time in order to stop the etching mechanism at a specific point in the first material layer 104 without further etching through the first material layer 104.

As shown in FIG. 2, in the step S213, after the step S211 of performing the first etching process and before the step S215 of performing the second etching process, an etching environment adjustment process is performed (step S213). Furthermore, in the step S213, the etching environment adjustment is performed in the etching chamber where the first etching process and the second etching process are performed. In addition, the etching environment adjustment process can be, for example but not limited to, an inert gas plasma treatment and the etching environment adjustment process is performed with the use of an adjustment agent. The adjustment agent includes an inert gas. Furthermore, the inert gas is selected from a group consisting of argon, helium, neon, xenon, radon and the inert gas mixture thereof. Preferably, the flow rate of the inert gas is about 10~1000 sccm. In addition, the etching environment adjustment process is performed at a process temperature of about 0~120° C. Furthermore, the etching environment adjustment process is performed for about 5~60 seconds. Moreover, while the etching environment adjustment process is performed in the etching chamber, the source power is about 20~800 Watts and the bias power is tuned off for preventing the substrate from being damaged. Preferably, the source power for the etching environment adjustment process is about 20~600 Watts.

As shown in FIG. 1C and FIG. 2, after the step S213, the step S215 is performed. That is, a second etching process 110 (as shown in FIG. 1C) is performed to remove rest exposed portion of the first material layer 104 to form a pattern 104b in the first material layer 104 exposing a portion of the second material layer 102. Meanwhile, a real-time etching monitor process is performed together with the second etching process, wherein the real-time etching monitor process generates a real-time detection spectrum for an etching endpoint catching purpose. In addition, the second etching process 110 is accomplished by performing a second plasma etching process with the use of a second etching gas mixture as a source gas, wherein the second etching gas mixture includes a gas mixture containing $SF_6$ and HBr.

Figure 3:
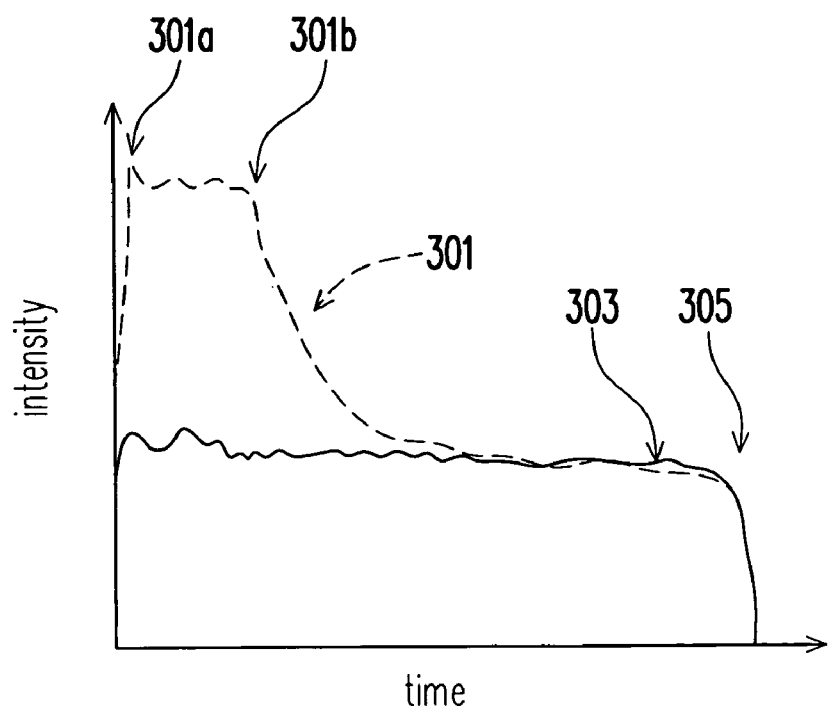
FIG. 3 is a signal intensity-time plot diagram showing the real-time spectrums of an etching process from the real-time etching monitor process before and after an etching environment adjustment process.

FIG. 3 is a signal intensity-time plot diagram showing the real-time spectrums of an etching process from the real-time etching monitor process before and after an etching environment adjustment process. As shown in FIG. 3, the dotted line 301 indicates a real-time monitor spectrum of the second etching process while the etching environment adjustment process is not performed beforehand. Moreover, the line 303 denotes the other real-time monitor spectrum of the second etching process performed subsequent to the etching environment adjustment process. The spectrums can be, for example but not limited to, obtained by using the optical emission spectrometry. It should be noticed that, as for line 301, the slop of the line 301 dramatically changes several times, such as at points 301a and 301b, before the last huge signal drop at point 305, which indicates the endpoint of the second etching process. On the other words, before the endpoint of the second etching process is reached, the signal of the real-time monitor spectrum roughly changes and it takes a relatively long time to stabilize the spectrum signal as the etching environment adjustment process is not performed beforehand. Accordingly, the roughly changing spectrum signal will make the endpoint catching more difficult and leads to endpoint false alarm.

On the other hand, in the present invention, since the etching environment adjustment process is performed before the second etching process is performed, the real-time monitor spectrum of the second etching process (line 303) is relatively smooth. Moreover, before the endpoint of the second etching process is reached, the signal intensity is stable. That is, it takes a relatively short time for the signal to reach a stable level during the second etching process is performed before the signal drop point 305. Therefore, the signal drop which indicates the endpoint of the second etching process is more conspicuous in comparison with the stable signal prior to the signal drop. Accordingly, it is easy to sense the endpoint of the second etching process according to the real-time monitor spectrum so as to terminate the second etching process in time.

In this embodiment, the present invention is described by an etching method for patterning the first material layer over the second material layer, wherein the first material layer and the second material layer are made of different materials. That is, the present invention can be applied to pattern any material substance as long as the material of the underlay of the material substance is different from the material layer the material substance. On the other words, by applying the etching environment adjustment process in the etching process, the endpoint of the etching process performed subsequent to the etching environment adjustment process can be accurately caught and the etching process is terminated as the surface of the underlay material layer is just exposed. Hence, the process window of the end-point control process for the over etching process is enlarged so that the posterior etching process can be well controlled.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. An etching method for patterning a first material layer over a second material layer to expose a portion of the second material layer, comprising:
   performing a first etching process to remove a portion of the first material layer in an etching chamber;
   performing an etching environment adjustment process in the etching chamber subsequent to the first etching process; and
   performing, subsequent to the etching environment adjustment process, a second etching process on the first material layer and a real-time etching monitor process for generating an endpoint detection spectrum, wherein at least one of signals of the endpoint detection spectrum is stabilized by the etching environment adjustment process.

2. The etching method of claim 1, wherein the etching environment adjustment process is performed with the use of an adjustment agent.

3. The etching method of claim 2, wherein the adjustment agent includes an inert gas.

4. The etching method of claim 3, wherein the inert gas is selected from a group consisting of helium, neon, xenon, radon and the inert gas mixture thereof.

5. The etching method of claim 3, wherein the flow rate of the inert gas is about 10~1000 sccm.

6. The etching method of claim 1, wherein the etching environment adjustment process is performed for about 5~60 seconds.

7. The etching method of claim 1, wherein a source power for the etching environment adjustment process is about 20~800 Watts while the etching environment adjustment process is performed.

8. The etching method of claim 1, wherein a source power for the etching environment adjustment process is about 20~600 Watts.

9. The etching method of claim 1, wherein the first material and the second material layer are made of different materials.

10. A method for catching an endpoint of an etching process, wherein the etching process is performed in an etching chamber, comprising:
    performing an inert gas plasma treatment with an adjustment agent in the etching chamber; and
    performing, subsequent to the inert gas plasma treatment, an etching process and a real-time etching monitor process for generating an endpoint detection spectrum, wherein at least one of signals of the endpoint detection spectrum is stabilized by the inert gas plasma treatment.

11. The method of claim 10, wherein the adjustment agent includes an inert gas.

12. The method of claim 11, wherein the inert gas is selected from a group consisting of argon, helium, neon, xenon, radon and the inert gas mixture thereof.

13. The method of claim 11, wherein the flow rate of the inert gas is about 10~1000 sccm.

14. The method of claim 10, wherein the inert gas plasma treatment is performed for about 5~60 seconds.

15. The method of claim 10, wherein a source power is about 20~800 Watts while the inert gas plasma treatment is performed.

16. The method of claim 10, wherein a source power for the inert gas plasma treatment is about 20~600 Watts.

* * * * *